(12) United States Patent
Sarma et al.

(10) Patent No.: US 6,498,073 B2
(45) Date of Patent: Dec. 24, 2002

(54) BACK ILLUMINATED IMAGER WITH ENHANCED UV TO NEAR IR SENSITIVITY

(75) Inventors: Kalluri R. Sarma, Mesa, AZ (US); Charles S. Chanley, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 12 days.

(21) Appl. No.: 09/753,530

(22) Filed: Jan. 2, 2001

(65) Prior Publication Data

US 2002/0084474 A1 Jul. 4, 2002

(51) Int. Cl.[7] .................. H01L 21/301; H01L 21/46; H01L 21/78; H01L 21/30; H01L 21/00
(52) U.S. Cl. .................. 438/459; 438/464; 438/67; 438/149
(58) Field of Search .................. 438/455, 456, 438/451, 458, 459, 464, 149, 64, 65, 67; 156/344, 584

(56) References Cited

U.S. PATENT DOCUMENTS

| | | | |
|---|---|---|---|
| 4,656,519 A | | 4/1987 | Savoye .................. 358/213 |
| 5,227,313 A | | 7/1993 | Gluck et al. .................. 437/2 |
| 5,270,221 A | | 12/1993 | Garcia et al. .................. 437/2 |
| 5,276,345 A | * | 1/1994 | Siegel et al. .................. 257/352 |
| 5,391,257 A | * | 2/1995 | Sullivan et al. .................. 156/630 |
| 5,395,788 A | * | 3/1995 | Abe et al. .................. 437/61 |
| 5,754,228 A | | 5/1998 | Dyck .................. 348/266 |
| 5,773,355 A | * | 6/1998 | Inoue et al. .................. 438/459 |
| 5,863,830 A | * | 1/1999 | Bruel et al. .................. 438/478 |
| 6,025,585 A | | 2/2000 | Holland .................. 250/208 |
| 6,287,891 B1 | * | 9/2001 | Sayyah .................. 438/106 |
| 6,214,733 B1 | * | 4/2002 | Sickmiller .................. 438/691 |

* cited by examiner

Primary Examiner—John F. Niebling
Assistant Examiner—Viktor Simkovic

(57) ABSTRACT

The present invention is a back illuminated image array device and a method of constructing such a device. The device is generally comprised of an array circuitry layer, a front layer, and a quartz layer. The array circuitry layer is defined on one surface of the front layer. The quartz layer is mounted on the other surface of the front layer. The method of fabricating the device is generally comprised of the following steps. The method provides a wafer having a thick silicon layer, an oxide layer on the thick silicon layer, and a front silicon layer on the oxide layer. The front layer has a first surface and a second surface with the second surface proximal to the oxide layer. Array circuitry is formed on the first surface of the front layer. A temporary layer is applied to the surface of the array circuitry. The thick silicon layer and the oxide layers are removed from the wafer, thereby, exposing the second surface of the front layer. A quartz layer is applied to the second surface. The temporary layer is removed from the array surface.

17 Claims, 2 Drawing Sheets

BACK ILLUMINATED IMAGER WITH ENHANCED UV TO NEAR IR SENSITIVITY

BACKGROUND OF THE INVENTION

The present invention is generally related to the field of imagers, such as, photon detectors and image sensors/focal plane arrays. In particular, the present invention relates to a back illuminated image array device and a method of constructing such a device.

Imagers such as photon detectors, image sensors/focal plane arrays, and the like, are of interest in a wide variety of sensing and imaging applications in a wide range of fields including consumer, commercial, industrial, and space.

Presently, imagers based on charge coupled devices (CCDs) are most widely utilized. However, imagers based on charge injection devices (CIDs) are gaining popularity since they provide unique performance characteristics over CCDs, such as, a non-destructive readout, superior anti-blooming, inherent radiation tolerance, random pixel addressing, and high readout rates. CIDs are becoming utilized more, particularly, in applications where their unique performance characteristics are advantageous. It is in the field of these two types of imagers in which the present invention can be best utilized.

Both of these imagers are typically fabricated on a silicon wafer, more typically, a wafer having an epitaxial silicon front layer. These devices are typically designed for front side illumination. Front side illumination, while traditionally utilized in standard imagers, has significant performance limitations such as: 1) low fill factor/low sensitivity and 2) limited spectral response, particularly in the UV to blue region of the spectrum.

The problem of low fill factor/low sensitivity is typically due to the shadowing caused by the presence of opaque metal bus lines, and absorption by the array circuitry structure formed on the front surface in the pixel region. Thus, the active region of the pixel is typically very small (low fill factor) in large format (high-resolution) front illuminated imagers. This structure reduces the overall sensitivity of the imager.

The problem of limited spectral response, particularly in the UV to blue region of the spectrum, is also typically due to the absorption of these wavelengths in the UV to blue region by the array circuitry structure.

To solve these problems, back illuminated CCDs have been proposed in the prior art. They are typically fabricated by thinning of the silicon wafer after fabricating the CCD circuitry by techniques such as surface grinding and mechanical polishing, and etching of the back of the silicon wafer. However, this approach limits the minimum silicon wafer thickness due to the need for the silicon wafer to be self-supporting and accessible for illumination from the back side. A silicon thickness for the optimum UV to near IR response is typically in the range of 5–10 microns. This is difficult to achieve using the prior art techniques that produce self-supporting silicon structures with backside thinning.

The present invention addresses these needs, as well as other problems associated with existing imager devices.

SUMMARY OF THE INVENTION

The present invention is a back illuminated image array device and a method of constructing such a device. The device is generally comprised of an array circuitry layer, a front layer, and a quartz layer. The array circuitry layer is defined on one surface of a front layer. The quartz layer is mounted on the other surface of the front layer.

The method of fabricating the device is generally comprised of the following steps. The method provides a Silicon-on-Insulator (SOI) wafer having a thick silicon layer, an oxide ($SiO_2$) layer on the thick silicon layer, and a thin front silicon layer on the oxide layer. The front layer has a first surface and a second surface with the second surface proximal to the oxide layer. Array circuitry is formed on the first surface of the front layer. A temporary layer is applied to the surface of the array circuitry. The thick silicon layer and the oxide layers are removed from the wafer, thereby, exposing the second surface of the front layer. A quartz layer is applied to the second surface. The temporary layer is removed from the array surface.

The aforementioned benefits and other benefits including specific features of the invention will become clear from the following description by reference to the accompanying drawings.

DETAILED DESCRIPTION OF THE INVENTION

Figure 1A:
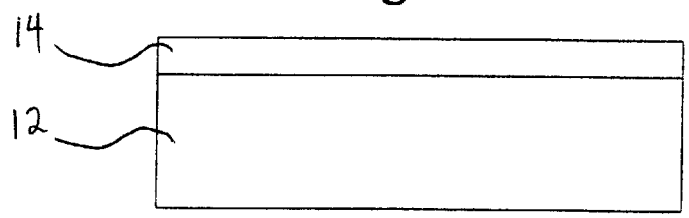
FIG. 1a is a cross-sectional view of a typical wafer having an epitaxial layer thereon.
Figure 1B:
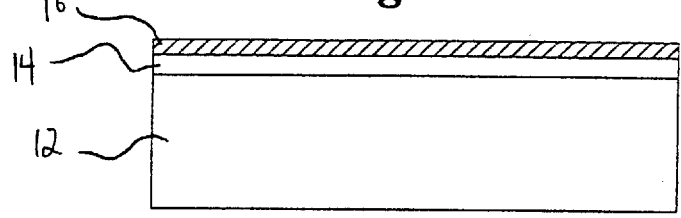
FIG. 1b is a cross-sectional view of the wafer of FIG. 1a with array circuitry formed on the front layer, thereby forming a front illuminated imager.

Referring now to the drawings wherein like reference numerals denote like elements throughout the several views, FIG. 1a illustrates a typical thick silicon layer 12 having an epitaxial layer 14 thereon. FIG. 1b depicts a typical wafer 12, as shown in FIG. 1a, that has been modified into a front illuminated imager 10, through the formation of array circuitry 16 on the front surface of the epitaxial layer. This structure is further illustrated in FIG. 2.

Figure 2:
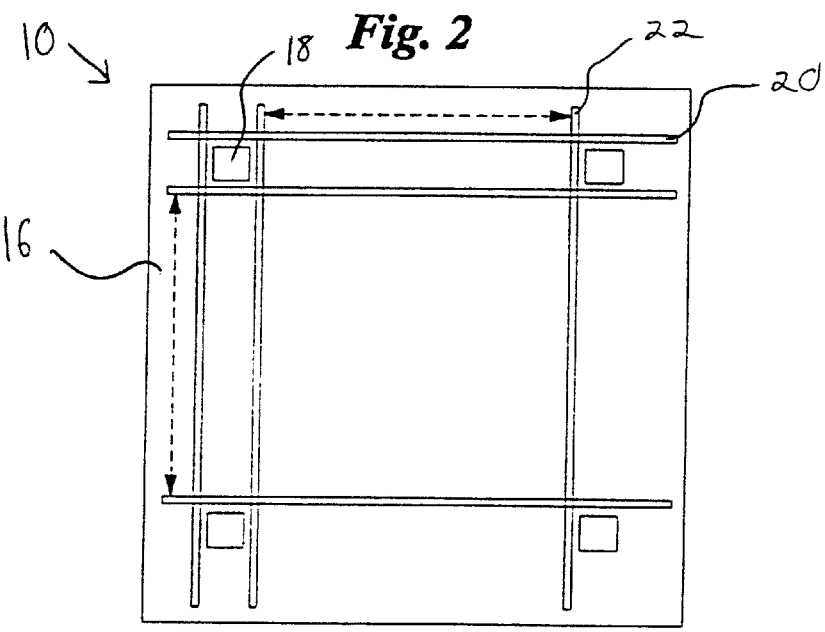
FIG. 2 is a front plan view of a typical front illuminated imaging array.

FIG. 2 is a front view of the device 10 showing the array circuitry formed by row electrodes 20 and column electrodes 22. The active region of a pixel is denoted by number 18. As this figure illustrates, a substantial portion of each of the pixels of the device are rendered inactive by the structure of the array circuitry.

Figure 3:
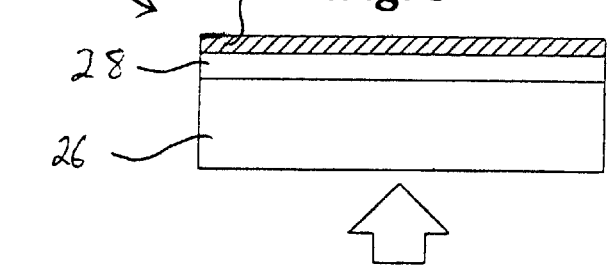
FIG. 3 is a cross-sectional view of an embodiment of the device of the present invention.

FIG. 3 shows a schematic structure of an embodiment of a back illuminated CID-type imager array device 20 of the present invention. The figure depicts imager circuitry 24 fabricated on the first surface of a front layer 28 with a desired layer thickness in the range of 3–20 microns. The second surface of the front layer 28 is intimately bonded to a quartz layer 26. The quartz layer 26 is transparent in the desired UV to near IR spectral region. The imager array device structure of this embodiment allows backside illumination, approximately 100% pixel fill factor and enhanced response in a broad spectral region in the approximate range of 200 nm to 1100 nm. While we refer to CID imagers in the following discussion, the technique is also applicable for fabricating back illuminated structures for achieving a high fill factor and enhanced UV response using CCD array circuitry.

FIGS. 4a–4f illustrate the steps of the fabrication process for achieving the device structure shown in FIG. 3. The process provides a standard Silicon-on-Insulator (SOI) wafer 30, comprised of a thick silicon layer 32, a silicon dioxide layer 34 positioned on the thick silicon layer, and a front layer 36 positioned on the oxide layer. All of these components are preferably comprised of silicon based materials and can be provided on a standard silicon-on-insulator wafer (SOI). The desired front layer thickness is typically in the range of 5–10 microns, while the oxide thickness is typically in the range of 1–3 microns. These types of wafers are commercially available (e.g. from S E H America located in Vancouver, Wash.), and are fabricated by well-known wafer bonding and thinning techniques.

Figure 4A:
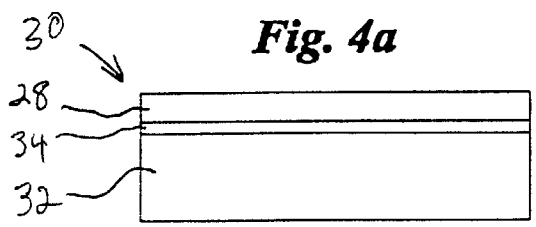
FIG. 4a is a cross-sectional view of a typical Silicon-on-Insulator (SOI) wafer that can be utilized with the present invention.

The wafer shown in FIG. 4a is then subjected to standard array circuitry fabrication processes. For a CID array these processes include thin film deposition, ion implantation, and photolithography to form the array circuitry layer as shown in FIG. 4b.

Figure 4B:
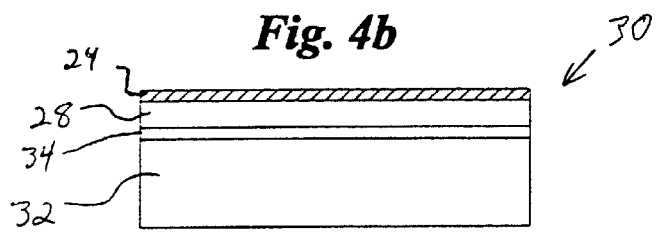
FIG. 4b is a cross-sectional view of the wafer of FIG. 4a, wherein array circuitry is formed thereon.
Figure 4C:
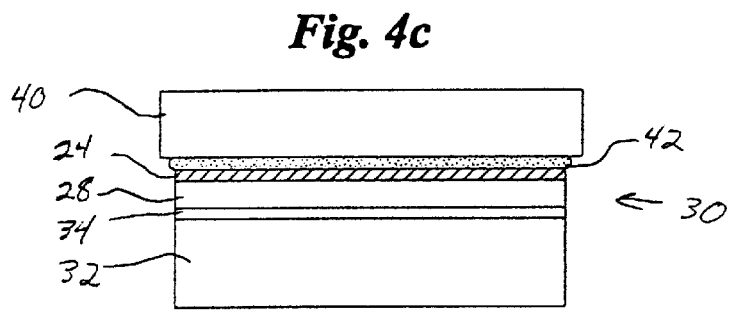
FIG. 4c is cross-sectional view of the wafer of FIG. 4b, wherein a temporary layer has been applied to the surface of the array circuitry.

The processed wafer 30 in FIG. 4b is then bonded to a temporary layer 40 such as glass or a silicon wafer, etc., as shown in FIG. 4c. The temporary layer 40 may be re-useable.

Prior to bonding, the processed wafer array circuitry surface 24 may be planarized by such techniques as a spin-on-glass and chem-mechanical polishing (CMP) to present a very flat surface (without any topography) for the bonding step. Bonding the wafer 30 to the temporary layer 40 can be accomplished by use of an adhesive material 42, such as wax or other temporary adhesive.

Figure 4D:
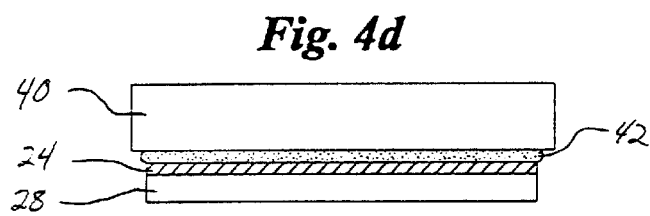
FIG. 4d is a cross-sectional view of the wafer of FIG. 4c, wherein the insulating and oxide layers of the wafer have been removed.

The adhesive material should preferably be capable of removal by low-temperature melting (approximately 100 degrees C. is one such suitable temperature), or by dissolving the material in a solvent. The thick silicon layer 32 and the oxide (preferably SiO$_2$) layer 34 in the wafer structure 30 are then removed as shown in FIG. 4d, typically by surface grinding and selective chemical etching. Most of the thick silicon 32 and oxide layer 34 may be removed quickly by surface grinding. The remaining thick silicon layer and the oxide layer materials are removed precisely, preferably by selective chemical etching, thereby uncovering the second surface of the front layer 24.

When using silicon based materials, the utilization of potassium hydroxide(KOH) solution that etches silicon selectively over an SiO$_2$ layer is preferred. When a SiO$_2$ layer is utilized, etching it selectively over the front layer by a buffered oxide etch is also preferred.

The second surface of the front layer 24 is cleaned to achieve a hydrophilic surface and directly bonded to the surface of a quartz layer 26. The surface of the quartz layer that is bonded to the front layer should also preferably be a clean, hydrophilic surface.

The temporary layer 40 is removed from the structure by removing the temporary adhesive 42 by means such as, melting it and cleaning it off, or dissolving it an appropriate solvent. The planarization layer is etched to expose the bond pads of the imager array to complete the fabrication process.

In addition, this approach, allows backside processing of the front layer 28 prior to bonding to the quartz layer 26. For example, a heavily doped silicon layer can be fabricated at the quartz-front layer interface (by ion implantation and rapid thermal annealing) to force the carriers towards the junction for improved sensitivity and spectral response.

Figure 4E:
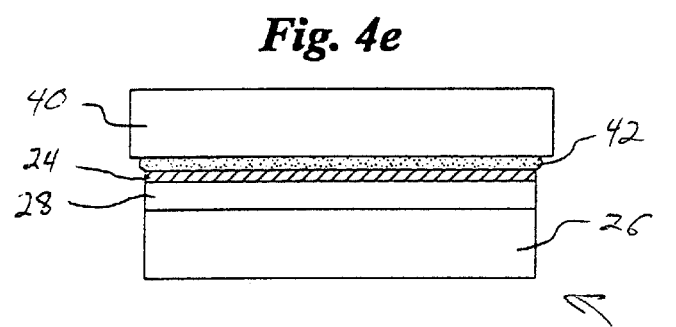
FIG. 4e is a cross-sectional view of the wafer of FIG. 4d, wherein a quartz layer has been applied to the second surface of the front layer.
Figure 4F:
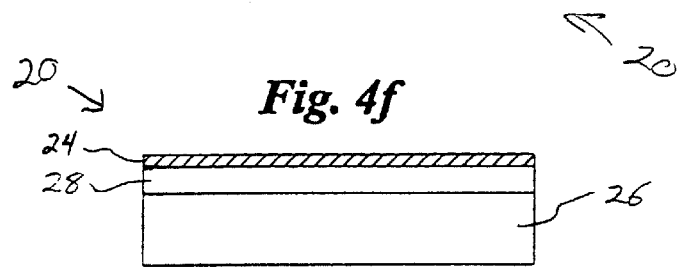
FIG. 4f is a cross-sectional view of the wafer of FIG. 4e, wherein the temporary layer has been removed, leaving an embodiment of the device of the present invention.

When utilized in a silicon based material, the room temperature bonding of the quartz layer to the silicon front surface in, as shown in FIG. 4e, would generally provide sufficient bond strength, for subsequent scribing (cutting) of the wafer into individual arrays and packaging them into imagers. The bonding of the quartz layer to the front layer may be accomplished in any manner known in the art, so long as the array circuitry is not damaged during the bonding process. One such method is the heating of the second surface of the front layer, thereby bonding it to the quartz layer.

In another embodiment of the invention, the processed wafer in FIG. 4b can be diced (cut) in to individual imaging arrays (typically 1"×1" or less in area) and then processed through the rest of the steps shown in FIGS. 4c through 4f. In this case, the bond strength between the front layer 28 and quartz layer 26 can be enhanced if desired, by rapid high temperature treatment of the front layer/quartz layer interface in a rapid thermal annealing (RTA) system (for approximately 1 second) or pulsed laser (for <<1 second) annealing system.

In this process, the optical radiation will impinge from the quartz layer side and since the quartz layer 26 is transparent to the RTA and laser annealer wavelengths, the layer 26 does not absorb the optical radiation. However, the front layer 28 does absorb the radiation, and the absorption of the optical radiation at the second surface of the front layer heats the front layer/quartz layer interface region.

This rapid thermal treatment raises the front layer/quartz layer interface temperature to about 1000 degrees C., to enhance the bond strength, while the bulk of the quartz layer 26, the front layer 28, and the array circuitry remain essentially near the room temperature to prevent the thermal stresses from becoming an issue. The individual arrays bonded to the quartz layer are then packaged by conventional techniques into imagers.

Since many possible embodiments may be made of the present invention without departing from the scope thereof, it is to be understood that all matter herein set forth or shown in the accompanying drawings is to be interpreted in the illustrative and not limiting sense.

What is claimed is:

1. A method of constructing a back illuminated image array device, the steps of the method comprising:
   providing a Silicon-on-Insulator (SOI) wafer having a thick silicon layer, an oxide layer on said thick silicon layer, and a front silicon layer on said oxide layer, said front layer having a first surface and a second surface wherein said second surface is proximal said oxide layer;
   forming array circuitry on the first surface of said front layer;
   applying a temporary layer to the surface of said array circuitry;

removing said thick silicon layer and the oxide layers from said wafer, exposing the second surface of said front layer;

applying a quartz layer to said second surface; and removing said temporary layer.

2. The method according to claim 1, wherein the surface of the front layer is cleaned to achieve a hydrophilic surface and said quartz layer has a hydrophilic surface and wherein the two hydrophilic surfaces are directly bonded together.

3. The method according to claim 1, wherein the quartz layer is applied at room temperature.

4. The method according to claim 1, wherein the quartz layer is transparent to UV and near IR wavelengths.

5. The method according to claim 1, wherein the quartz layer is bonded directly to the second surface.

6. The method according to claim 1, wherein the array circuitry is formed by deposition of a thin films, ion implantations, and photo lithographic patterning steps film.

7. The method according to claim 1, wherein the temporary layer is comprised of a material selected from the group consisting of: silicon wafers, glass and metal.

8. The method according to claim 1, wherein the array circuitry surface is planarized before application of said temporary layer.

9. The method according to claim 8, wherein the planarized surface is etched, when the temporary surface is removed, to expose the bond pads of the image array device.

10. The method according to claim 9, wherein the process of planarizing the surface is selected from the group consisting of: spin-on-glass and dielectric deposition and chem-mechanical polishing.

11. The method according to claim 1, wherein the step of applying the temporary layer is provided by temporary bonding means.

12. The method according to claim 11, wherein the temporary bonding means is selected from the group consisting of the application of: wax, low temperature melt adhesive, and adhesive that dissolves through application of a solvent.

13. The method according to claim 1, wherein the step of removing the thick silicon layer and the oxide layers is accomplished through a combination of grinding and etching.

14. A method of constructing a back illuminated image array device, the steps of the method comprising:

providing a wafer having a thick silicon layer, an oxide layer on said thick silicon layer, and a front silicon layer on said oxide layer, said front layer having a first surface and a second surface wherein said second surface is proximal said oxide layer;

forming array circuitry on the first surface of said front layer;

dicing said wafer into a plurality of smaller individual arrays;

applying a temporary layer to the first surface of each said array circuitry;

removing said thick silicon layer and the oxide layers from each said individual array wafers, exposing the second surface of said front layer;

applying a quartz layer to the second surface of each individual array wafer; and removing each said temporary layer.

15. The method according to claim 14, wherein the step of applying the quartz layer is accomplished by bonding the quartz directly to the second surface of the front layer.

16. The method according to claim 15, wherein the bonding of the quartz to the front layer is accomplished by applying rapid, local high temperature treatment to the interface between the front and quartz layers.

17. The method according to claim 16, wherein the high temperature treatment is provided by a means selected from the group consisting of: rapid thermal annealing and pulsed laser.

* * * * *